United States Patent
Shen et al.

(10) Patent No.: US 11,522,507 B2
(45) Date of Patent: Dec. 6, 2022

(54) ACTIVE COMMON MODE COMPENSATION FOR IMPROVED AMPLIFIER PERFORMANCE

(71) Applicant: SYNAPTICS INCORPORATED, San Jose, CA (US)

(72) Inventors: Dan Shen, Irvine, CA (US); Jinbao Lan, Chengdu (CN); Yunfu Zhang, Chengdu (CN); Lorenzo Crespi, Irvine, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 17/213,084

(22) Filed: Mar. 25, 2021

(65) Prior Publication Data
US 2022/0311393 A1    Sep. 29, 2022

(51) Int. Cl.
*H03F 3/217* (2006.01)
*H03F 3/45* (2006.01)
*H03F 1/02* (2006.01)

(52) U.S. Cl.
CPC ....... *H03F 3/217* (2013.01); *H03F 2200/129* (2013.01); *H03F 2200/375* (2013.01)

(58) Field of Classification Search
CPC ............... H03F 3/217; H03F 2200/129; H03F 2200/375
USPC ........................................ 330/10, 251, 207 A
See application file for complete search history.

(56) References Cited

U.S. PATENT DOCUMENTS

| | | | |
|---|---|---|---|
| 10,320,337 B2 * | 6/2019 | Zhao | H03F 3/45475 |
| 2010/0219891 A1 | 9/2010 | Tsuchiya | |
| 2017/0019078 A1 | 1/2017 | Galal | |
| 2018/0062583 A1 | 3/2018 | Zhao et al. | |

OTHER PUBLICATIONS

Extended European Search Report from European Application No. 22163757.2, dated Jul. 18, 2022, 9 pages.

* cited by examiner

*Primary Examiner* — Hieu P Nguyen
(74) *Attorney, Agent, or Firm* — Paradice & Li LLP (57) ABSTRACT

Various techniques are provided to reduce common mode disturbance associated with an amplifier, such as a class D amplifier. In one example, an amplifier includes a power stage configured to generate first and second PWM signals. The amplifier further includes an integration stage comprising input nodes configured to receive an input differential analog signal. The integration stage is configured to generate an output differential analog signal in response to the PWM signals and the input differential analog signal. The amplifier further includes an active compensation circuit configured to provide a compensation signal to the integration stage to reduce disturbances at the input nodes associated with the PWM signals switching between a common mode and a differential mode. Additional devices, systems, and methods are also provided.

18 Claims, 11 Drawing Sheets

ACTIVE COMMON MODE COMPENSATION FOR IMPROVED AMPLIFIER PERFORMANCE

TECHNICAL FIELD

The present invention relates generally to low power amplifiers and, more particularly, to improving performance and reducing amplifier power consumption.

BACKGROUND

In the field of electronics, class D amplifiers offer improved efficiency over other designs such as class AB amplifiers. For example, a class AB amplifier may operate at 10% efficiency when amplifying a 10% full scale signal. In contrast, a class D amplifier may operate at 90% efficiency when amplifying the same 10% full scale signal. Indeed, the smaller the signal, the bigger the efficiency advantage that is provided by a class D amplifier over a class AB amplifier.

However, class D amplifiers present design challenges. In operation, class D amplifiers may use differential pulse width modulation (PWM) signals. When such signals are switched between common mode (e.g., both low or both high) and differential mode (e.g., one low and one high), disturbances are introduced. Such disturbances may include, for example, analog voltage transitions that are not part of the original signal intended to be amplified. If left unchecked, such disturbances can require the amplifier to use additional power as it integrates the unintended voltage transitions and also introduces noise and distortion into the final amplified signal.

Conventionally, such disturbances may be mitigated by the use of large capacitors (e.g., 400 pf). However, such capacitors can complicate or restrict the design of products incorporating them as the capacitors may consume large portions of the physical area available in a circuit. This problem is especially acute in cases where a class D amplifier is desired to be implemented with a small form factor, such as consumer electronic devices.

SUMMARY

In accordance with embodiments set forth herein, various techniques are provided to reduce common mode disturbance associated with an amplifier, such as a class D amplifier. For example, an active common mode compensation circuit may be used to apply voltage offsets to the inputs of an integrator of a loop filter of the amplifier. Such offsets may be used to offset disturbances resulting from the switching of differential PWM signals between common mode and differential mode configurations. As a result, the integrator may be operated with reduced power, reduced noise, and reduced distortion. In addition, the compensation circuit may reduce or eliminate the need for large capacitors that are conventionally used for passively reducing disturbances.

In one embodiment, an amplifier includes a power stage configured to generate first and second PWM signals; an integration stage comprising input nodes configured to receive an input differential analog signal, wherein the integration stage is configured to generate an output differential analog signal in response to the PWM signals and the input differential analog signal; and an active compensation circuit configured to provide a compensation signal to the integration stage to reduce disturbances at the input nodes associated with the PWM signals switching between a common mode and a differential mode.

In another embodiment, a method includes providing, by a power stage of an amplifier, first and second PWM signals to an integration stage of the amplifier; receiving, at input nodes of the integration stage, an input differential analog signal; generating, by the integration stage, an output differential analog signal in response to the PWM signals and the input differential analog signal; and providing, by an active compensation circuit of the amplifier, a compensation signal to the integration stage to reduce disturbances at the input nodes associated with the PWM signals switching between a common mode and a differential mode.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

In accordance with embodiments set forth herein, various techniques are provided to reduce common mode disturbance associated with a loop filter of an amplifier. For example, an active common mode compensation circuit may be used to apply voltage offsets to the inputs of an integrator of a loop filter of the class D amplifier. Such an approach can reduce or eliminate conventional capacitors that may be otherwise be used in a low pass filter to passively reduce common mode disturbance. In addition, such an approach permits a differential current source signal to be applied directly to the integrator in some embodiments.

Figure 1:
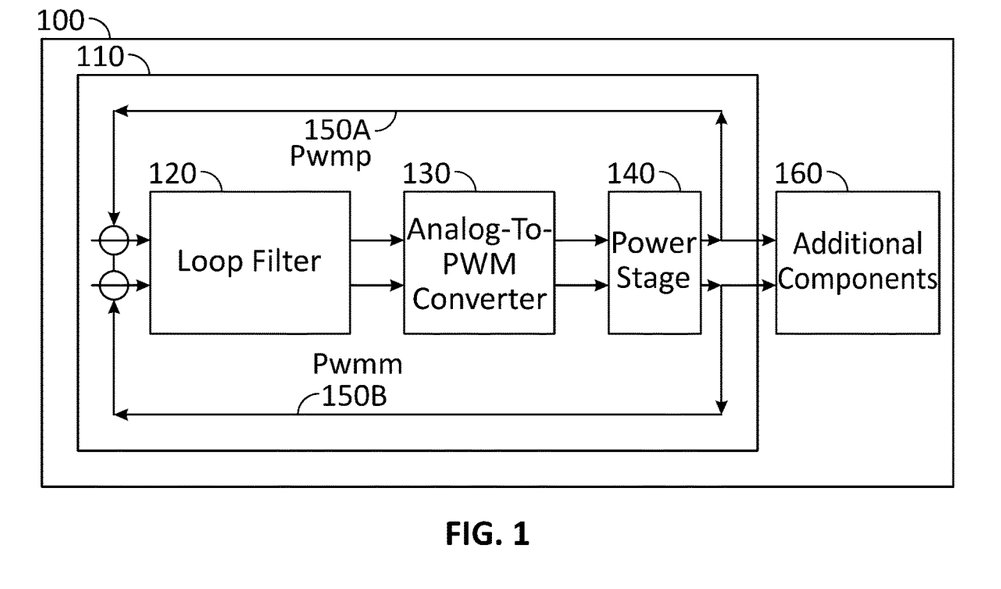
FIG. 1 illustrates a system including a class D amplifier in accordance with an embodiment of the disclosure.

Turning now to the drawings, FIG. 1 illustrates a system 100 including a class D amplifier 110 in accordance with an embodiment of the disclosure. In various embodiments, system 100 may be any appropriate system with electronics used to amplify signals. For example, in some embodiments, system 100 may be a wireless headset system (e.g., a Bluetooth headset) used to amplify audio signals for listening by a user. System 100 may be other types of consumer electronic devices or other systems in various embodiments.

Amplifier 110 includes a loop filter 120, an analog-to-PWM converter 130, a power stage 140, and feedback paths 150A-B. In operation, loop filter 120 integrates a differential analog signal through one or more integration stages (e.g., further shown in FIGS. 2 and 3). Converter 130 converts the integrated differential analog signal to differential PWM signals. Power stage 140 amplifies the differential PWM signals to provide PWM signals pwmp and pwmm which may be combined as appropriate for use (e.g., applied to one or more additional components 160 (e.g., a speaker or other appropriate component) of system 100. As shown, amplified PWM signals pwmp and pwmm are fed back to loop filter 120 through feedback paths 150A-B to operate loop filter 120 as further discussed herein.

Figure 2:
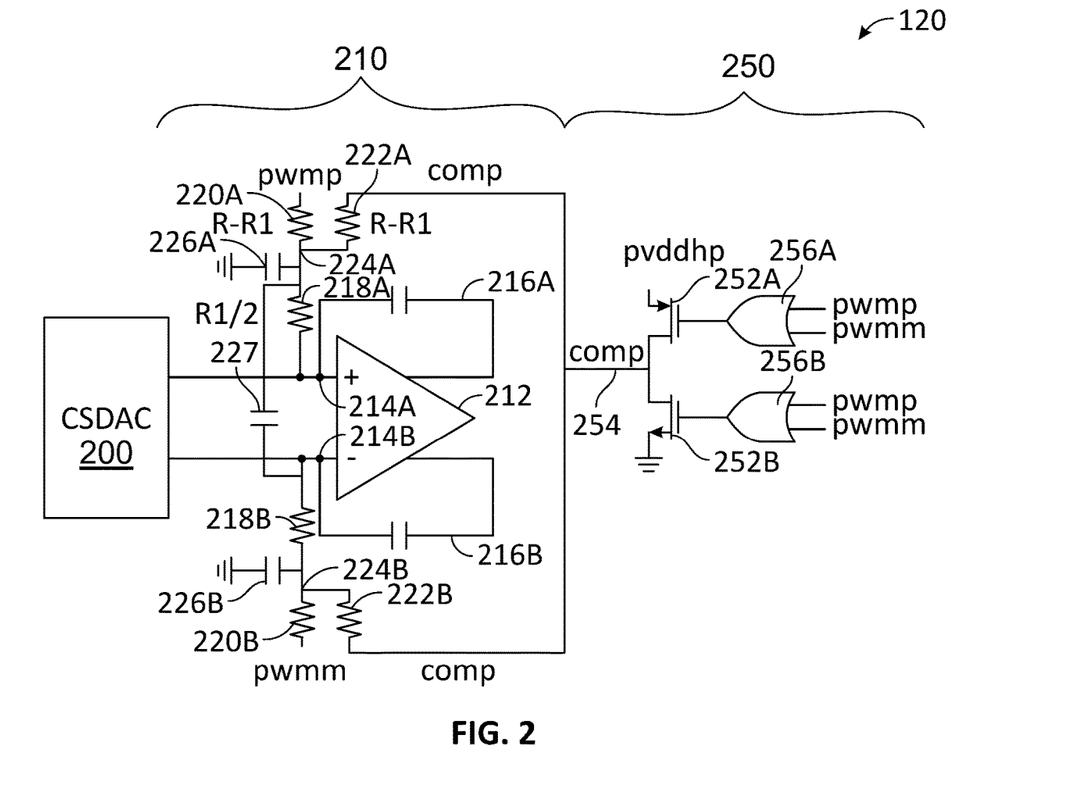
FIG. 2 illustrates an integration stage and additional circuitry of a class D amplifier in accordance with an embodiment of the disclosure.

FIG. 2 illustrates a signal source 200, an integration stage 210, and an active compensation circuit 250 of loop filter 120 provided in amplifier 110 in accordance with an embodiment of the disclosure.

Signal source 200 may be any signal source desired to be amplified by amplifier 110. In FIG. 2, signal source 200 is a current source digital-to-analog converter (CSDAC). In this case, signal source 200 provides an input differential analog current signal that is received and integrated by integration stage 210.

Figure 3:
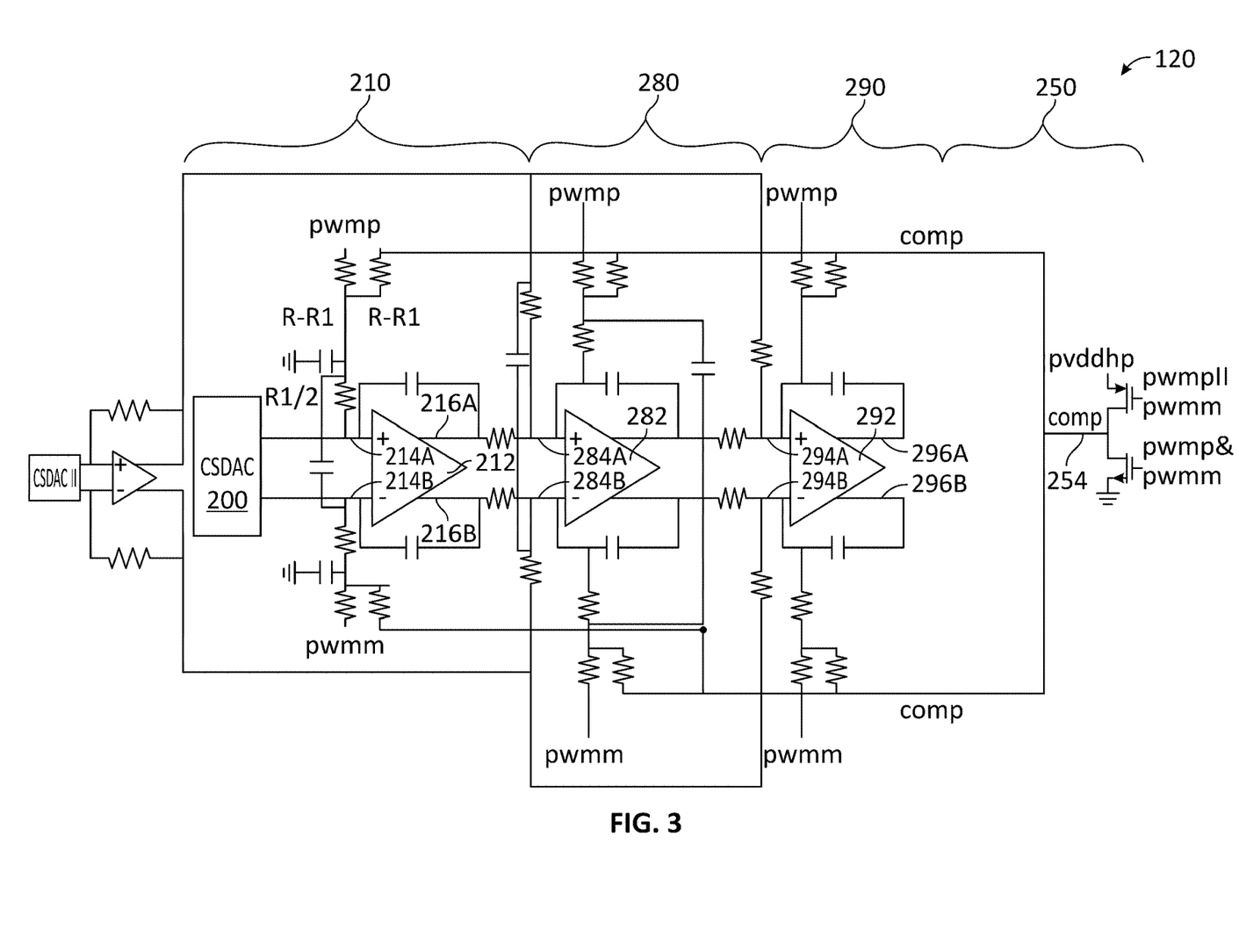
FIG. 3 illustrates a plurality of integration stages of a class D amplifier in accordance with an embodiment of the disclosure.

Integration stage 210 includes an integrator 212 (e.g., an operational amplifier and/or other appropriate integration circuit) with input nodes 214A-B and output nodes 216A-B. Input nodes 214A-B receive the differential analog current signal provided by signal source 200. Output nodes 216A-B provide a resulting output differential analog signal (e.g., an integrated differential analog signal) to an appropriate downstream component (e.g., another integration stage as shown in FIG. 3 or converter 130) which is also fed back to input nodes 214A-B through feedback paths as shown.

Integration stage 210 further includes resistors 218A-B and 220A-B. Resistors 220A and 220B receive amplified PWM signals pwmp and pwmm from power stage 140 through feedback paths 150A-B (e.g., shown in FIG. 1). As PWM signals pwmp and pwmm alternate between low and high voltages (e.g., between 0 volts and 1.1 volts, between 0 volts and 1.8 volts, or other voltages) the differential analog current signal provided by signal source 200 will be converted to input voltages at input nodes 214A-B as a result of current flow through resistors 218A-B and 220A-B. In this regard, the voltages at input nodes 214A-B to be integrated by integrator 212 are generated in response to the differential analog current signal and the switching of the PWM signals pwmp and pwmm between low and high voltages (e.g., voltage transitions of the PWM signals pwmp and pwmm).

In various embodiments, as PWM signals pwmp and pwmm cycle, they may exhibit both differential mode and common mode behavior. In differential mode, PWM signals pwmp and pwmm exhibit different voltages (e.g., low and high respectively, or high and low respectively). In common mode, PWM signals pwmp and pwmm exhibit the same voltages (e.g., both low, or both high).

As discussed, when PWM signals pwmp and pwmm are switched between common mode (e.g., both low or both high) and differential mode (e.g., one low and one high), disturbances are introduced. For example, in FIG. 2, such disturbances may manifest as unintended changes in voltage at input nodes 214A-B. Such disturbances can require integrator 212 to use additional power as it integrates the unintended voltage transitions and also introduces noise and distortion into the final amplified signal.

In order to reduce the disturbances, loop filter 120 further includes compensation circuit 250. Compensation circuit 250 includes transistors 252A-B, circuit path 254, and logic circuits 256A-B. As shown, logic circuits 256A-B (e.g., OR and AND gates, respectively) receive PWM signals pwmp and pwmm and provide resulting logic output signals to gates of transistors 252A-B. PMOS transistor 252A is connected to a voltage source (labeled pvddhp) and NMOS transistor 252B is connected to ground. Transistors 252A-B provide a compensation signal (e.g., labeled comp) to circuit path 254 (e.g., and therefore also to resistors 222A-B) synchronously with and in response to PWM signals pwmp and pwmm in accordance with the following Table 1:

TABLE 1

| Row | pwmp voltage | pwmm voltage | OR logic circuit 256A output voltage | AND logic circuit 256B output voltage | Transistor 252A state | Transistor 252B state | Circuit path 254 compensation signal comp |
|---|---|---|---|---|---|---|---|
| 1 | low | low | 0 | 0 | on | off | high (pvddhp) |
| 2 | low | high | 1 | 0 | off | off | float (pvddhp/2) |
| 3 | high | low | 1 | 0 | off | off | float (pvddhp/2) |
| 4 | high | high | 1 | 1 | off | on | low (ground) |

As set forth in Table 1, a high compensation signal value (e.g., a voltage of pvddhp) will be provided to circuit path 254 and resistors 222A-B when both PWM signals pwmp and pwmm are low (e.g., low common mode). A low compensation signal value (e.g., a voltage of zero) will be provided when both PWM signals pwmp and pwmm are high (e.g., high common mode). An intermediate compensation signal value (e.g., a voltage of pvddhp/2 due to circuit path 254 floating as a result of both transistors 252A-B being turned off) will be provided when PWM signals pwmp and pwmm are different (e.g., differential mode). Although particular transistors 252A-B and logic circuits 256A-B are provided in FIG. 2, other circuits (e.g., one or more inverters, other logic circuits, and/or other components) may be used as appropriate.

Thus, it will be appreciated that the compensation signal comp provided by compensation circuit 250 will be actively adjusted with and correlate to the common mode or differential mode operation of PWM signals pwmp and pwmm. By applying the compensation signal to resistors 222A-B, the voltages at nodes 224A-B and 214A-B will be affected by the voltages provided by PWM signals pwmp and pwmm as well as compensation signal comp. In particular, the voltage of compensation signal comp will operate to offset disturbances at input nodes 214A-B resulting from the switching of PWM signals pwmp and pwmm between common mode and differential mode.

Although compensation circuit 250 is illustrated as directly receiving PWM signals pwmp and pwmm, other embodiments are contemplated. For example, other signals correlated with, synchronized with, and/or related to PWM signals pwmp and pwmm may be used to generate compensation signal comp in various embodiments.

As shown, integration stage 210 further includes optional capacitors 226A-B which may be used to implement low pass filters to further reduce the disturbances caused by the switching of PWM signals pwmp and pwmm between common mode and differential mode. Because compensation circuit 250 already substantially reduces or eliminates the disturbances, capacitors 226A-B may be implemented with a relatively small size (e.g., 5 pf) in comparison with conventional low pass filter capacitors (e.g., 400 pf). An additional optional capacitor 227 may be removed in some embodiments.

As discussed, loop filter 120 may include one or more integration stages. Accordingly, FIG. 3 expands upon the embodiment of FIG. 2 and illustrates integration stages 210, 280, and 290 implemented in series with each other and provided in loop filter 120 in accordance with an embodiment of the disclosure.

As shown, FIG. 3 includes the integration stage 210 of FIG. 2 feeding integration stage 280 which feeds integration stage 290. Output nodes 296A-B of integration stage 290A-B may provide a resulting integrated differential analog signal to an appropriate downstream component such as converter 130.

Integration stages 210, 280, and 290 receive PWM signals pwmp and pwmm (e.g., from power stage 140 of FIG. 1), and further receive compensation signal comp from compensation circuit 250. Accordingly, disturbances at input nodes 214A-B, 284A-B, and 294A-B of integrators 212, 282, and 292, respectively, may be compensated for in the manner discussed with regard to FIG. 2.

Figure 4:
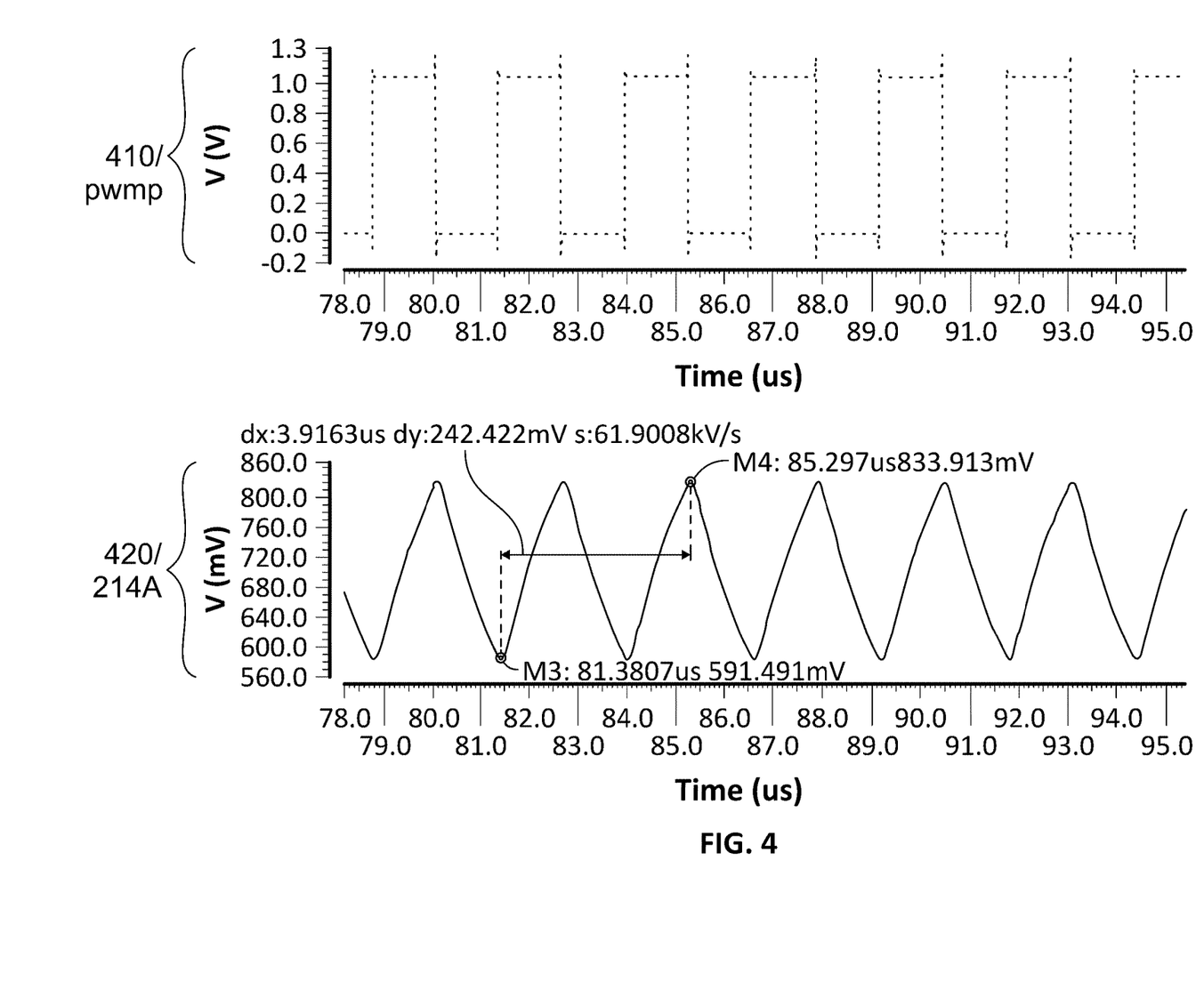
FIG. 4 illustrates voltage plots of a class D amplifier without common mode compensation applied in accordance with an embodiment of the disclosure.

FIG. 4 illustrates voltage plots of various signals of loop filter 120 without common mode compensation applied in accordance with an embodiment of the disclosure. Plot 410 illustrates PWM signal pwmp. Plot 420 illustrates the voltage at input node 214A of integration stage 210 without compensation signal comp applied. Plot 430 illustrates the voltage at input node 284A of integration stage 280 without compensation signal comp applied.

As shown, when compensation signal comp is not applied, the voltages at input nodes 214A and 284B are continuously changing which is the voltage disturbance manifested by the switching of PWM signals pwmp and pwmm between common mode and differential mode. As a result of this continuous changing of the voltage at input nodes 214A and 284B, integrators 212 and 282 are forced to continuously operate, thus increasing their power usage and also introducing associated noise and distortion into the output signal of amplifier 110.

Figure 5:
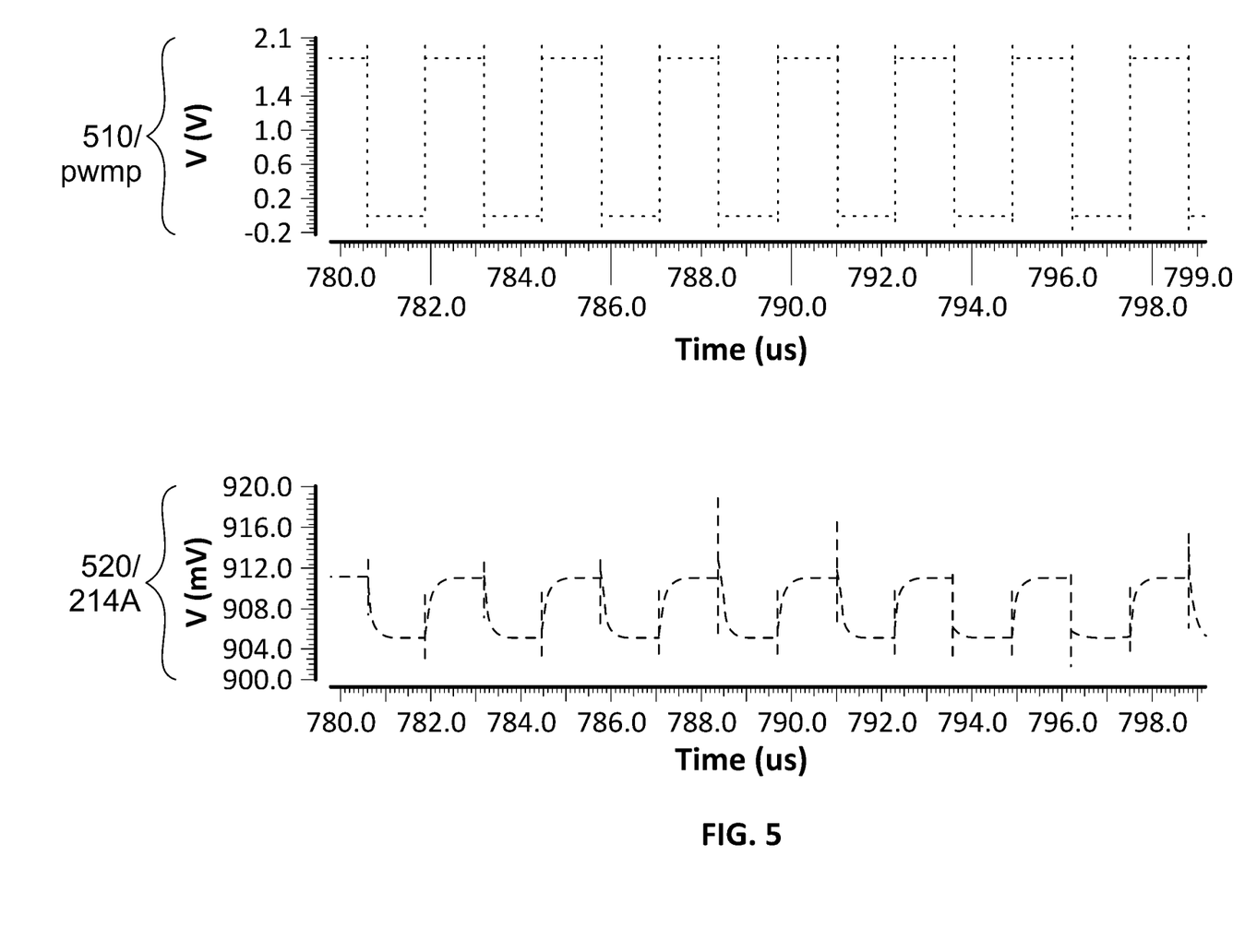
FIG. 5 illustrates voltage plots of a class D amplifier with common mode compensation applied to one integration stage in accordance with an embodiment of the disclosure.

FIG. 5 illustrates voltage plots of various signals of loop filter 120 with common mode compensation applied to integration stage 210 but not applied to integration stage 280 in accordance with an embodiment of the disclosure. Plot 510 illustrates PWM signal pwmp. Plot 520 illustrates the voltage at input node 214A of integration stage 210 with compensation signal comp applied. Plot 530 illustrates the voltage at input node 284A of integration stage 280 without compensation signal comp applied.

By comparing plots 420 and 520 of FIGS. 4 and 5, it will be appreciated that when compensation signal comp is applied, the voltage at input node 214A settles quickly at a steady state (e.g., exhibits reduced disturbance) after PWM signals pwmp and pwmm switch between common mode and differential mode. This is further apparent by comparing plots 520 and 530 for integration stages 210 and 280 with and without compensation signal comp applied, respectively. As shown, plot 530 exhibits continuous voltage changes while plot 520 reaches and holds various steady states quickly. Thus, in this case, integrator 212 will not be forced to continuously operate, thereby reducing its power usage and also reducing noise and distortion in the output signal of amplifier 110. Meanwhile, integrator 282 will continue to exhibit the problems discussed with regard to integrator 212 in FIG. 4.

Figure 6:
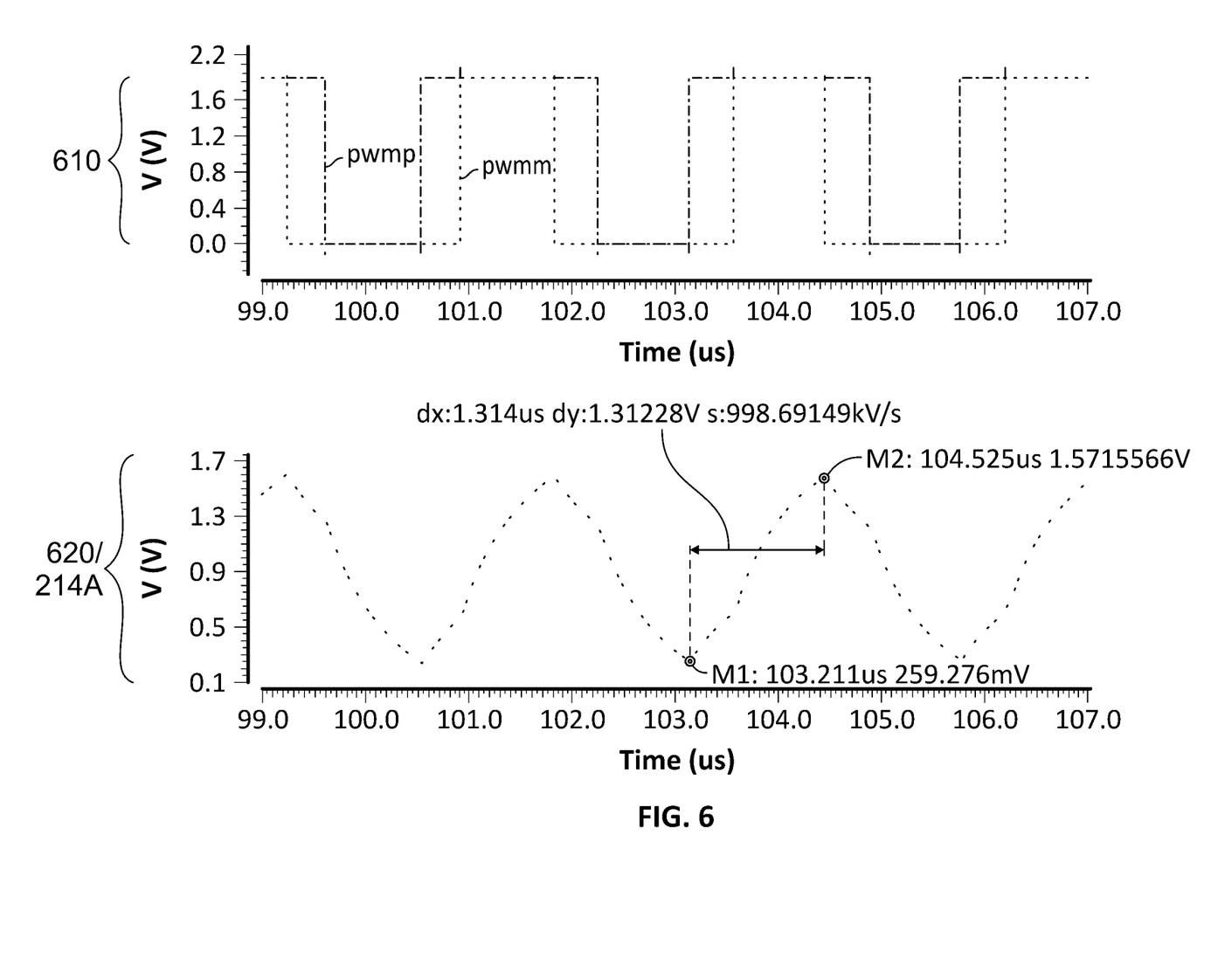
FIG. 6 illustrates another example of voltage plots of a class D amplifier without common mode compensation applied in accordance with an embodiment of the disclosure.

FIG. 6 illustrates another example of voltage plots of various signals of loop filter 120 without common mode compensation applied in accordance with an embodiment of the disclosure. Plot 610 illustrates PWM signals pwmp and pwmm. Plot 620 illustrates the voltage at input node 214A of integration stage 210 without compensation signal comp applied. Plot 630 illustrates the voltage at input node 284A of integration stage 280 without compensation signal comp applied.

As similarly discussed with regard to FIG. 4, when compensation signal comp is not applied, the voltages at input nodes 214A and 284B are continuously changing and exhibiting voltage disturbances caused by the switching of PWM signals pwmp and pwmm between common mode and differential mode. As a result, integrators 212 and 282 are forced to continuously operate, thus causing the problems discussed with regard to FIG. 4.

Figure 7:
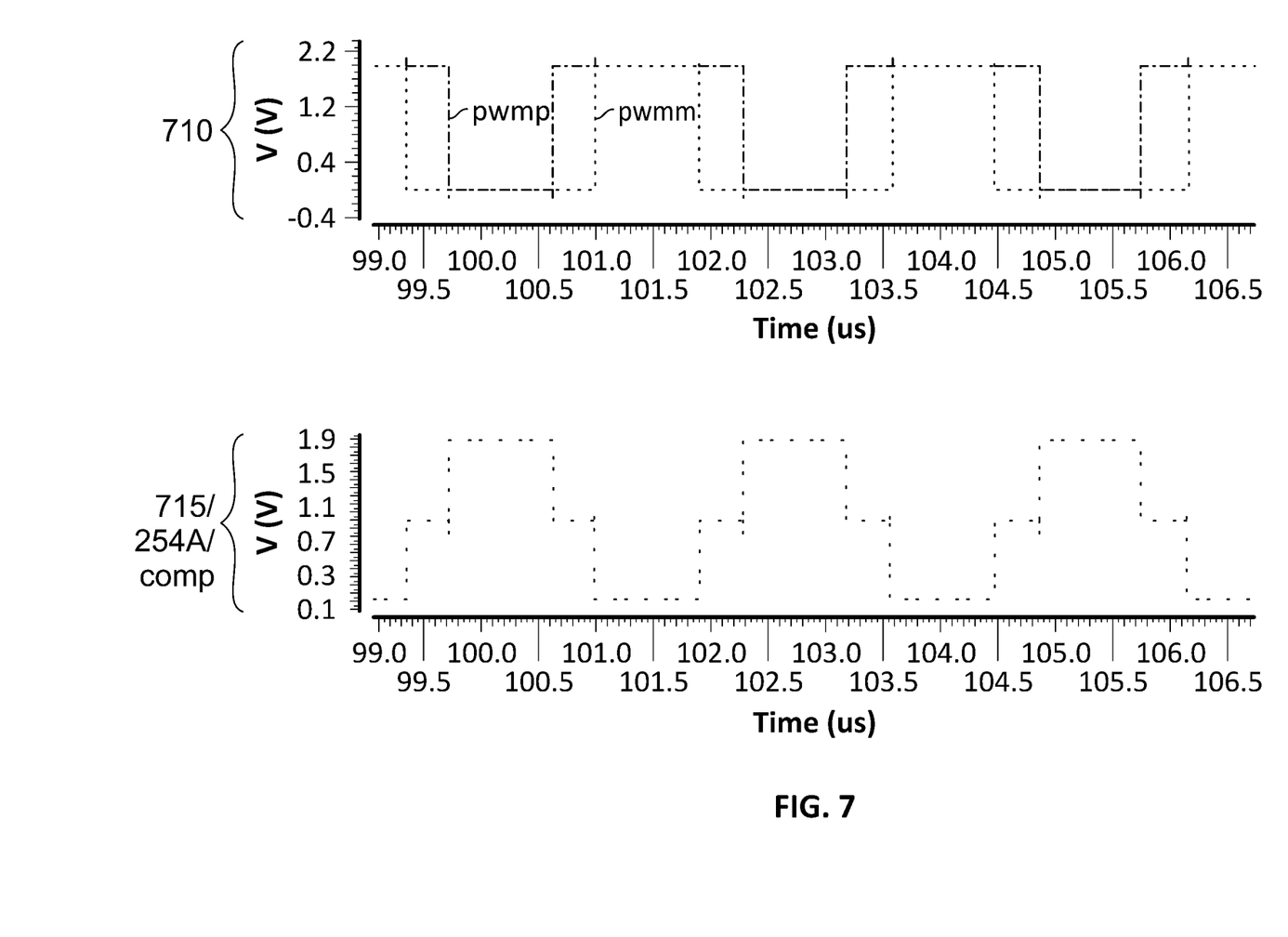
FIG. 7 illustrates voltage plots of a class D amplifier with common mode compensation applied to two integration stages in accordance with an embodiment of the disclosure.

FIG. 7 illustrates voltage plots of various signals of loop filter 120 with common mode compensation applied to both of integration stages 210 and 280 in accordance with an embodiment of the disclosure. Plot 710 illustrates PWM signals pwmp and pwmm. Plot 715 illustrates compensation signal comp. Plot 720 illustrates the voltage at input node 214A of integration stage 210 with compensation signal comp applied. Plot 730 illustrates the voltage at input node 284A of integration stage 280 also with compensation signal comp applied.

By referencing plots 710 and 715 together, it will be appreciated that compensation signal comp is synchronous with PWM signals pwmp and pwmm. In particular, plot 715 exhibits a low voltage (e.g. zero voltage) when PWM signals pwmp and pwmm are both high (e.g., a first common mode configuration), a high voltage (e.g., 1.8 volts) when PWM signals pwmp and pwmm are both low (e.g., a second common mode configuration), and an intermediate voltage (e.g., 0.9 volts) when PWM signals pwmp and pwmm differ from each other (e.g., differential mode configuration). It will be appreciated that this operation is similar to the operation of compensation circuit 250 and Table 1 as discussed. Other values of the high, low, and intermediate voltages may be used as appropriate for various embodiments.

By comparing plots 620 and 720, and likewise comparing plots 630 and 730, it will be appreciated that the voltages at input nodes 214A-B settle more quickly (e.g., exhibit reduced disturbance) after PWM signals pwmp and pwmm switch between common mode and differential mode when compensation signal comp is applied (e.g., in plots 720 and 730) than when it is not applied (e.g., in plots 620 and 630). Thus, when compensation signal comp is applied, integrators 212 and 282 may consume less power and accordingly reduce noise and distortion in the output signal of amplifier 110.

Although FIGS. 4 to 7 have been discussed in relation to integrators 212 and 282, similar results may be obtained by applying compensation signal comp to integrator 292 and additional integrators as desired.

Figure 8:
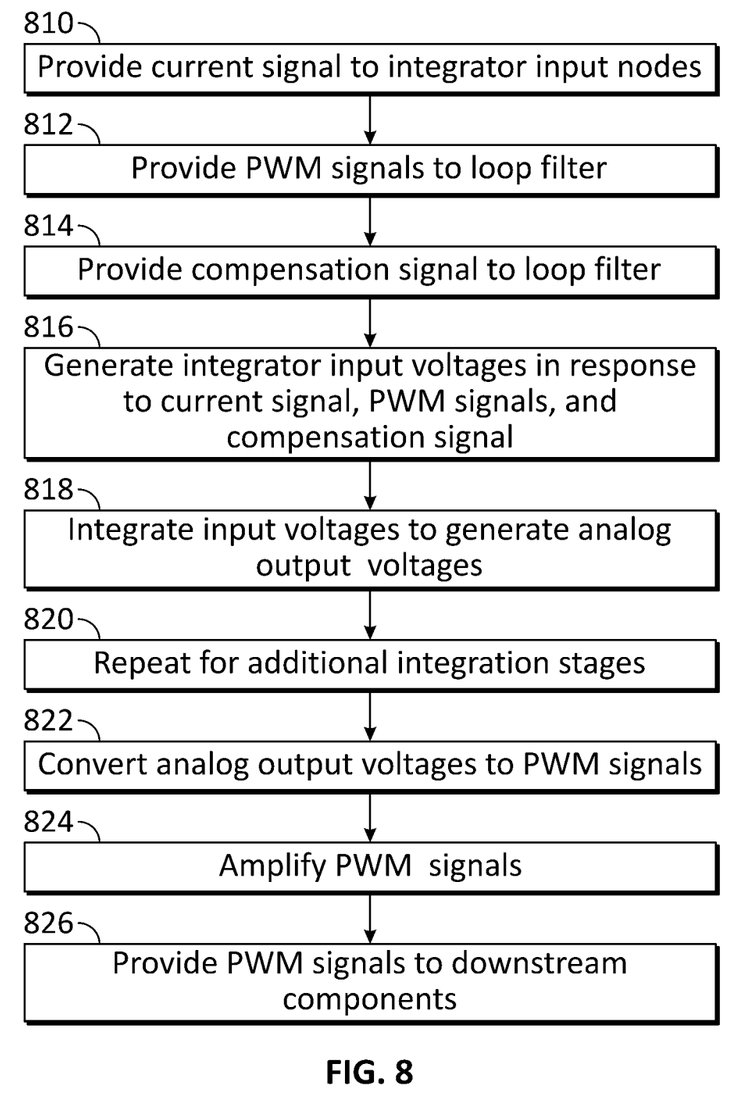
FIG. 8 illustrates a process performed by a class D amplifier in accordance with an embodiment of the disclosure.

FIG. 8 illustrates a process performed by amplifier 110 in accordance with an embodiment of the disclosure. Although various sequential blocks are illustrated, it will be appreciated that one or more of the blocks may be performed simultaneously and/or in a different order as appropriate.

In block 810, signal source 200 provides a differential current signal to input nodes 214A-B. In block 812, power stage 140 provides PWM signals pwmp and pwmm to resistors 220A-B of loop filter 120 through feedback paths 150A-B. In block 814, compensation circuit 250 generates compensation signal comp which is provided to resistors 222A-B of loop filter 120 through circuit path 254.

In block 816, input voltages are generated at input nodes 214A-B in response to the current signal received from signal source 200 flowing through one or more of resistors 218A, 220A, 218B, and 220B. As discussed, the application of compensation signal comp to resistors 222A-B (e.g., which affects the voltages at nodes 224A-B connected between resistors 218A/220A and 218B/220B) reduces the voltage disturbance at input nodes 214A-B that would otherwise be present as PWM signals pwmp and pwmm switch between common mode and differential mode.

In block 818, integrator 212 integrates the voltages at input nodes 214A-B to generate an integrated differential analog signal at output nodes 216A-B. In block 820, the preceding blocks 812 to 818 are repeated for integration stages 280 and 290 with integration stage 210 feeding integration stage 280 which feeds integration stage 290. As discussed, the operation of block 820 may be performed simultaneously with one or more of the other blocks discussed herein in some embodiments.

In block 822, converter 130 converts the integrated differential analog signal received from output nodes 296A-B of integration stage 290A-B to differential PWM signals. In block 824, power stage 140 amplifies the differential PWM signals to provide PWM signals pwmp and pwmm. In block 826, PWM signals pwmp and pwmm are provided to one or more additional components 160 for use by system 100 as discussed.

In view of the above disclosure, it will be appreciated that by incorporating active compensation circuit 250, class D amplifier 110 may be implemented in a manner that reduces voltage disturbances while also reducing or eliminating the use of capacitors for low pass filtering of such disturbances. In some embodiments, the use of compensation circuit 250 improves the total harmonic distortion of amplifier 110 from −90 dB to −105 dB. Such improved performance permits amplifier 110 to be used with HiFi quality signal amplification in audio applications. In addition, the reduction or elimination of such capacitors also permits a current based signal source (e.g., a CSDAC or otherwise) to be interfaced directly to integrator 212, thus permitting the current based signal source to be merged with loop filter 120.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa. Embodiments described above illustrate but do not limit the invention. It should also be understood that numerous modifications and variations are possible in accordance with the principles of the present invention. Accordingly, the scope of the invention is defined only by the following claims.

What is claimed is:

1. An amplifier comprising:
    a power stage configured to generate first and second PWM signals;
    an integration stage comprising input nodes configured to receive an input differential analog signal, wherein the integration stage is configured to generate an output differential analog signal in response to the PWM signals and the input differential analog signal; and
    an active compensation circuit configured to provide a compensation signal to the integration stage to reduce disturbances at the input nodes associated with the PWM signals switching between a common mode and a differential mode, the compensation signal having:
        a low voltage responsive to the PWM signals being in a first common mode configuration;
        a high voltage responsive to the PWM signals being in a second common mode configuration; and
        an intermediate voltage responsive to the PWM signals being in a differential mode configuration.

2. The amplifier of claim 1, wherein the compensation circuit comprises logic circuits configured to generate the compensation signal synchronously with the PWM signals.

3. The amplifier of claim 2, wherein the logic circuits are configured to receive the PWM signals and generate the compensation signal in response thereto.

4. The amplifier of claim 1, wherein:
    the integration stage and the compensation circuit are implemented in a loop filter of the amplifier; and
    the loop filter further comprises a differential analog current source configured to provide the input differential analog signal.

5. The amplifier of claim 4, wherein the integration stage is configured to generate the output differential analog signal in response to voltages generated at the input nodes by a current flow of the input differential analog signal in response to voltage transitions of the PWM signals.

6. The amplifier of claim 1, wherein:
    the integration stage is a first integration stage; and
    the amplifier further comprises second and third integration stages in series with the first integration stage and configured to receive the compensation signal.

7. The amplifier of claim 1, wherein the integration stage further comprises a capacitor of 5 pf or less configured to provide a low pass filter to further reduce the disturbances.

8. The amplifier of claim 1, wherein the amplifier is a class D amplifier.

9. The amplifier of claim 1, wherein the amplifier is implemented in a wireless headset system.

10. A method comprising:
    providing, by a power stage of an amplifier, first and second PWM signals to an integration stage of the amplifier;
    receiving, at input nodes of the integration stage, an input differential analog signal;
    generating, by the integration stage, an output differential analog signal in response to the PWM signals and the input differential analog signal; and
    providing, by an active compensation circuit of the amplifier, a compensation signal to the integration stage to reduce disturbances at the input nodes associated with the PWM signals switching between a common mode and a differential mode, the compensation signal having:
- a low voltage responsive to the PWM signals being in a first common mode configuration;
- a high voltage responsive to the PWM signals being in a second common mode configuration; and
- an intermediate voltage responsive to the PWM signals being in a differential mode configuration.

11. The method of claim 10, further comprising generating the compensation signal by logic circuits of the compensation circuit synchronously with the PWM signals.

12. The method of claim 11, further comprising:
receiving the PWM signals by the logic circuits; and
wherein the logic circuits generate the compensation circuit in response to the PWM signals.

13. The method of claim 10, wherein:
the integration stage and the compensation circuit are implemented in a loop filter of the amplifier; and
the method further comprises providing the input differential analog signal by a differential analog current source of the loop filter.

14. The method of claim 13, wherein the generating the output differential analog signal is performed in response to voltages generated at the input nodes by a current flow of the input differential analog signal in response to voltage transitions of the PWM signals.

15. The method of claim 10, wherein:
the integration stage is a first integration stage; and
the amplifier further comprises second and third integration stages in series with the first integration stage and configured to receive the compensation signal.

16. The method of claim 10, wherein the integration stage further comprises a capacitor of 5 pf or less configured to provide a low pass filter to further reduce the disturbances.

17. The method of claim 10, wherein the amplifier is a class D amplifier.

18. The method of claim 10, wherein the amplifier is implemented in a wireless headset system.

\* \* \* \* \*